(12) United States Patent
Ye et al.

(10) Patent No.: US 11,217,775 B2
(45) Date of Patent: Jan. 4, 2022

(54) OPTICAL WAVEGUIDE AND MANUFACTURING METHOD THEREOF, DISPLAY SUBSTRATE AND DISPLAY DEVICE

(71) Applicant: BOE TECHNOLOGY GROUP CO., LTD., Beijing (CN)

(72) Inventors: Zhijie Ye, Beijing (CN); Rui Peng, Beijing (CN); Xinxin Wang, Beijing (CN); Lei Huang, Beijing (CN); Wenbin Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 16/718,439

(22) Filed: Dec. 18, 2019

(65) Prior Publication Data

US 2020/0127236 A1    Apr. 23, 2020

Related U.S. Application Data

(62) Division of application No. 15/322,534, filed as application No. PCT/CN2016/083618 on May 27, 2016, now Pat. No. 10,553,826.

(30) Foreign Application Priority Data

Jan. 4, 2016    (CN) .......................... 201610000770.5

(51) Int. Cl.
*H01L 51/52*    (2006.01)
*G02B 6/08*    (2006.01)
(Continued)

(52) U.S. Cl.
CPC ............ *H01L 51/5262* (2013.01); *G02B 6/08* (2013.01); *H01L 51/0097* (2013.01); *G02B 1/045* (2013.01); *H01L 2251/5338* (2013.01)

(58) Field of Classification Search
CPC ............ H01L 51/5262; H01L 51/0097; H01L 2251/5338; H01L 27/3225; H01L 51/52;
(Continued)

(56) References Cited

U.S. PATENT DOCUMENTS 8,708,578 B2    4/2014    Shacklete
2009/0322736 A1    12/2009    Hioki et al.
(Continued)

FOREIGN PATENT DOCUMENTS

CN    1673779 A1    9/2005
CN    101614368 A1    12/2009
(Continued)

OTHER PUBLICATIONS

First Office Action for Chinese Patent Application No. 201610000770.5 dated Aug. 7, 2017.
(Continued)

*Primary Examiner* — Thanh T Nguyen
(74) *Attorney, Agent, or Firm* — Calfee, Halter & Griswold LLP

(57) ABSTRACT

An optical waveguide and manufacturing method thereof, display substrate and display device. The optical waveguide comprises an optical fiber array arranged on a surface where each optical fiber in the optical fiber array has a cylindrical shape and the axis of each optical fiber is perpendicular to the surface. With the effect of limitation and mixing of the optical fibers, the intensity and color of the light from the optical waveguide are basically homogeneous in the whole emitting range, such that the viewing angle characteristics of the display device are effectively improved and the problem of uneven brightness and color bias in the range of viewing angle is solved.

7 Claims, 4 Drawing Sheets

(51) Int. Cl.
*H01L 51/00* (2006.01)
*G02B 1/04* (2006.01)
(58) Field of Classification Search
CPC ......... G02B 6/08; G02B 1/045; Y02E 10/549;
C08L 33/08; C08L 69/00
See application file for complete search history.

(56) References Cited

U.S. PATENT DOCUMENTS

| | | | |
|---|---|---|---|
| 2009/0323329 A1 | 12/2009 | Lin | |
| 2010/0166359 A1* | 7/2010 | Fujimaki | G01N 21/552 |
| | | | 385/12 |
| 2012/0045169 A1* | 2/2012 | Hu | G02B 6/29311 |
| | | | 385/33 |
| 2014/0126242 A1 | 5/2014 | Chen | |
| 2014/0346532 A1 | 11/2014 | Kim | |

FOREIGN PATENT DOCUMENTS

| | | |
|---|---|---|
| CN | 102023329 A | 4/2011 |
| CN | 104319352 | 1/2015 |
| CN | 204179111 | 2/2015 |
| CN | 104505029 | 4/2015 |

OTHER PUBLICATIONS

International Search Report for PCT/CN2016/083618 dated Sep. 8, 2016.

* cited by examiner

OPTICAL WAVEGUIDE AND MANUFACTURING METHOD THEREOF, DISPLAY SUBSTRATE AND DISPLAY DEVICE

RELATED APPLICATIONS

The present application is a divisional application of U.S. Ser. No. 15/322,534, filed on Dec. 28, 2016, which is the U.S. national phase entry of the international application PCT/CN2016/083618, with an international filing date of May 27, 2016, which claims the benefit of Chinese Patent Application No. 201610000770.5, filed on Jan. 4, 2016, the entire disclosures of which are incorporated herein by reference.

TECHNICAL FIELD

The present invention relates to the field of display technology, in particular to an optical waveguide and manufacturing method thereof, display substrate and display device.

BACKGROUND

Whether an electroluminescent device (for example, but not limited to OLED device) is a bottom emitting device or a top emitting device, there is an effect of resonant microcavity to some extent. The effect of resonant microcavity mainly refers to the redistribution of photon density in different energy states, so that only certain wavelengths of light meet the mode of the resonant microcavity can be emitted at a specific angle. Therefore, in an electroluminescent device and a display device using an electroluminescence device, the intensity and color of the emitted light will change with the exit angle.

For example, whether an OLED is a bottom emitting device or a top emitting device, there is an effect of resonant microcavity to some extent. The cathode of a bottom emitting OLED device has high reflectivity, the anode of it has high transmittance, so the effect of resonant microcavity is not very significant; while the cathode of a top emitting OLED device is typically a translucent metal electrode, resulting in multi-beam interference; therefore the effect of resonant microcavity is significant. FIG. 1 shows a schematic diagram of the light intensity-angle distribution of the existing OLED device. Numerical values 0-1 are used to indicate the normalized light intensity. In the exit direction of the OLED device, the light intensity has a maximum value. The light intensity decreases gradually with the increase of the viewing angle. In the aspect of color, the existing OLED devices and various display devices (for example but not limited to liquid crystal displays) also have the similar viewing angle characteristics.

In order to improve the viewing angle characteristics, the common method is coating the light exit surface of the OLED device with a scattering layer, but the effect is limited.

SUMMARY

Therefore, it is desirable to improve the viewing angle characteristics of the display device, so as to avoid the decrease of the display effect caused by the viewing angle characteristics of the display device.

To this end, embodiments of the present invention provide an optical waveguide and manufacturing method thereof, display substrate and display device. With the effect of limitation and mixing of the optical fibers, the intensity and color of the light from the optical waveguide are basically homogeneous in the whole emitting range, effectively improving the viewing angle characteristics of the display device, and solving the problem of uneven brightness and color bias in the range of viewing angle.

An embodiment provides an optical waveguide. The optical waveguide comprises an optical fiber array arranged on a surface; each optical fiber in the optical fiber array has a cylindrical shape; the axis of each optical fiber is perpendicular to the surface.

Optionally, the cylindrical shape satisfies the relationship of D/L<0.33 where D is the diameter of the cylindrical shape and L is the height of the cylindrical shape.

Optionally, each optical fiber in the optical fiber array is made of a first material; the cylindrical surface of each optical fiber is covered by a second material. The refractive index of the first material is higher than the refractive index of the second material.

Optionally, the first material is $Al_2O_3$, $MgO$, $Y_2O_3$, $CeF_3$, $LaF_3$, $SiO$ or $YF_3$; the second material is $MgF_2$, $SiO_2$, $BaF_2$, $AlF_3$, $CaF_2$, $LiF$, $Na_3AlF_6$, $Al_3F_{14}Na_5$ or $NaF$.

Optionally, the optical waveguide further comprises a flexible sheet; the flexible sheet is integrally formed with the optical fiber array. The axis of each optical fiber is perpendicular to the surface of the flexible sheet.

Optionally, the flexible sheet and the optical fiber array are made of PC or PMMA.

Optionally, the surface is a plane.

Optionally, the optical fiber array is a hexagonal array.

An embodiment of the present invention further provides a method for manufacturing an optical waveguide. The method comprises arranging an optical fiber array on a surface. Each optical fiber in the optical fiber array has a cylindrical shape; the axis of each optical fiber is perpendicular to the surface.

Optionally, the cylindrical shape meets D/L<0.33; D is the diameter of the cylindrical shape, and L is the height of the cylindrical shape.

Optionally, the surface is a surface of a substrate. The step of arranging an optical fiber array on the surface comprises: preparing a layer of a first material on the surface of the substrate; etching the layer of the first material into an optical fiber array using lithography process; covering the surface of the optical fiber array with a layer of a second material; and removing the second material from the top of the optical fiber in the optical fiber array. The refractive index of the first material is higher than the refractive index of the second material.

Optionally, the first material is $Al_2O_3$, $MgO$, $Y_2O_3$, $CeF_3$, $LaF_3$, $SiO$ or $YF_3$; the second material is $MgF_2$, $SiO_2$, $BaF_2$, $AlF_3$, $CaF_2$, $LiF$, $Na_3AlF_6$, $Al_3F_{14}Na_5$ or $NaF$.

Optionally, the surface is a surface of a substrate. The step of arranging an optical fiber array on the surface comprises: preparing a layer of a first material on the surface of the substrate; and imprinting the layer of the first material into an optical fiber array or a flexible sheet with an optical fiber array. The axis of each optical fiber is perpendicular to the surface of the flexible sheet.

Optionally, the first material is PC or PMMA.

Optionally, the surface is a plane.

Optionally, the optical fiber array is a hexagonal array.

An embodiment of the present invention further provides a display substrate. The display substrate comprises a light output surface and the optical waveguide according to the abovementioned embodiments; the optical waveguide is attached to the light output surface.

Optionally, the light output surface is a light output surface of an OLED array.

Optionally, the display substrate is a flexible display substrate.

An embodiment of the present invention further provides a display device. The display device comprises the display substrate according to the abovementioned embodiments.

In the optical waveguide and manufacturing method thereof, display substrate and display device provided by the embodiments of the present invention, with the effect of limitation and mixing of optical fibers, the intensity and color of the light from the optical waveguide are basically homogeneous in the whole emitting range, effectively improving the viewing angle characteristics of the display device, and solving the problem of uneven brightness and color bias in the range of viewing angle.

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

DETAILED DESCRIPTION OF THE INVENTION

In the following, the technical solutions in embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Figure 1:
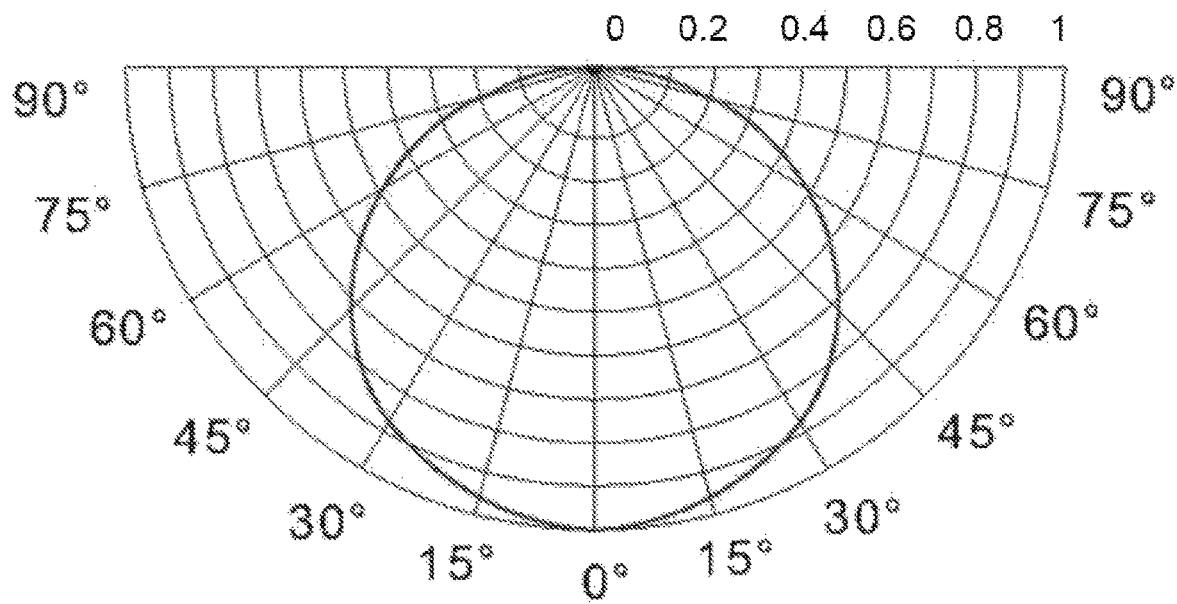
FIG. 1 is a schematic diagram of the light intensity-angle distribution of the existing OLED device.
Figure 2:
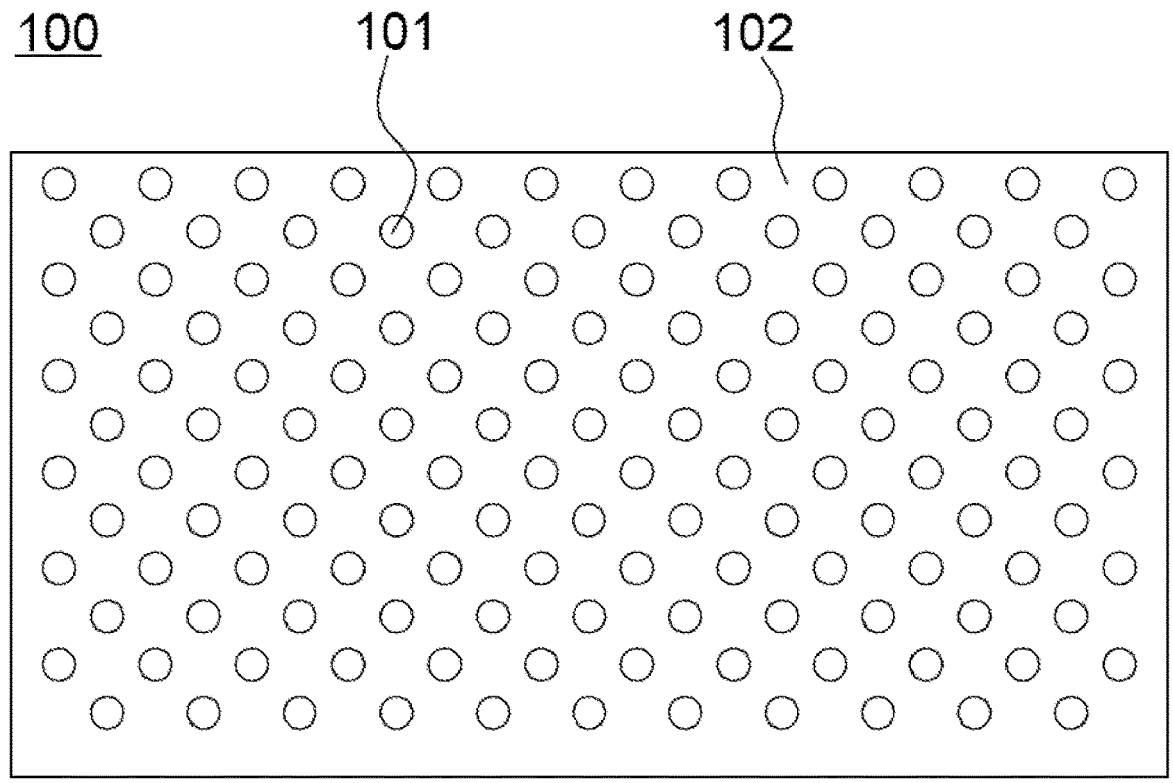
FIG. 2 is a structural schematic diagram of an optical waveguide according to an embodiment of the present invention.
Figure 3:
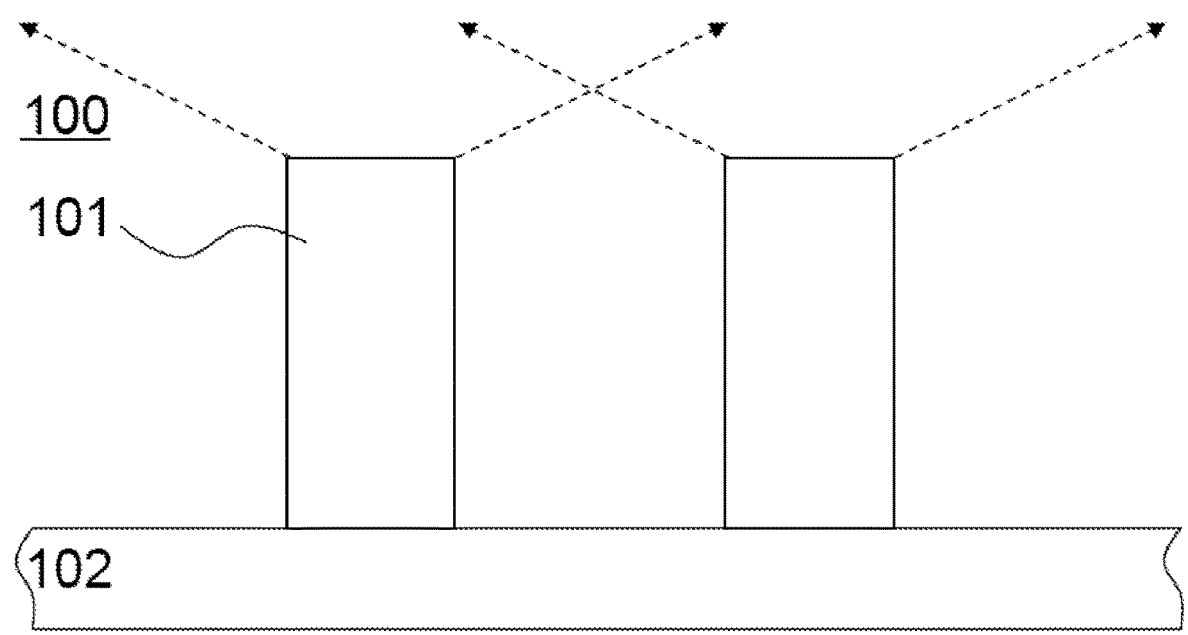
FIG. 3 is a local section view of an optical waveguide according to an embodiment of the present invention.

FIG. 2 is a structural schematic diagram of an optical waveguide according to an embodiment of the present invention; and FIG. 3 is a local section view of an optical waveguide according to an embodiment of the present invention. As shown in FIG. 2 and FIG. 3, the optical waveguide 100 comprises an optical fiber array arranged on a surface; each optical fiber 101 in the optical fiber array has a cylindrical shape; the axis of each optical fiber 101 is perpendicular to the surface.

As shown in FIG. 2 and FIG. 3, the optical fiber array can be arranged on a transparent substrate 102. The optical fiber array can also be arranged on a light exit surface of a light emitting device or a display device. The light exit surface of the transparent substrate 102, light emitting device or display device can be a curved surface or a plane. Therefore, the term "surface" in the context of the present invention can be construed as a curved surface or a plane.

Due to the total reflection effect, the incident light into the optical fiber undergoes multiple total reflections in the optical fiber. On the light exit surface of each optical fiber, the emitted light will be limited in a certain range of a cone, which is decided by the refractive index difference between inside and outside of the optical fiber, i.e., the range of a cone is decided by the numerical aperture NA of the optical fiber. Therefore, even if the light intensity and color of the incident light into the optical fiber change with angle, after conduction and mixing by the optical fiber, the light intensity and color of the emitted light from the optical fiber are basically homogeneous in the range of the cone. With the effect of limitation and mixing of the optical fibers, the intensity and color of the light from the optical waveguide are basically homogeneous in the whole emitting range, effectively improving the viewing angle characteristics of the display device, and solving the problem of uneven brightness and color bias in the range of viewing angle.

By applying the optical waveguide according to the embodiment of the present invention, the emitted light can be uniformly distributed in a relatively large range of viewing angle (as shown with the dash lines in FIG. 3), effectively improving the viewing angle characteristics of the display device.

The optical waveguide can be applied on a light exit surface of an OLED array (or, on a light exit surface of an OLED display panel), effectively improving the viewing angle characteristics of the OLED display device, and solving the problem of uneven brightness and color bias in the range of viewing angle. Moreover, those skilled in the art can understand that the diameter of the optical fiber (i.e., the diameter D of the cylindrical shape) in the optical waveguide can be predetermined based on the size of the pixel. For example, for an OLED pixel size of 300 nm*100 nm, the diameter of the optical fiber can be predetermined as 50 nm-500 nm; due to the homogeneous distribution of the optical fibers, the optical waveguide can effectively improve the viewing angle characteristics of the display device with substantially no loss of light, without alignment between the respective pixels and the optical fibers.

Optionally, the cylindrical shape meets D/L<0.33; D is the diameter of the cylindrical shape, and L is the height of the cylindrical shape.

If the cylindrical shape meets D/L<0.33, the effect of limitation and mixing of optical fibers is more significant, the viewing angle characteristics of the display device can be further improved.

Figure 4:
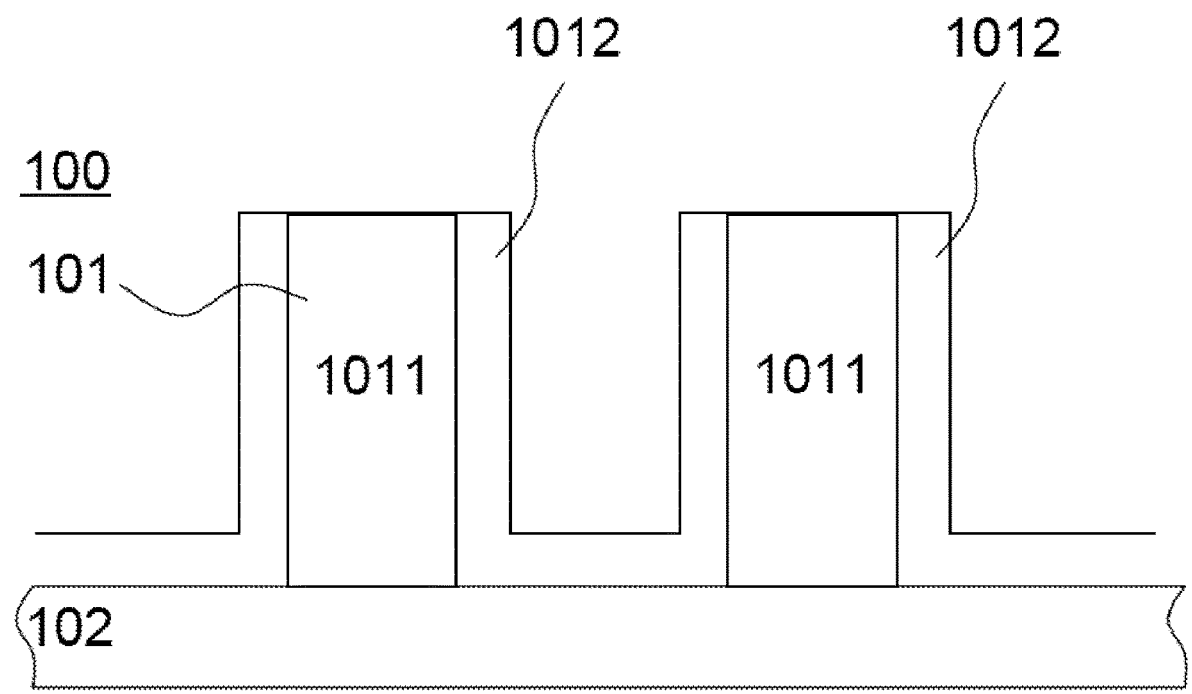
FIG. 4 is a local section view of an optical waveguide according to another embodiment of the present invention.

FIG. 4 is a local section view of an optical waveguide according to another embodiment of the present invention. Optionally, each optical fiber 101 in the optical fiber array is made of a first material 1011; the cylindrical surface of each optical fiber 101 is covered by a second material 1012. The refractive index of the first material 1011 is higher than the refractive index of the second material 1012.

With the refractive index difference between the first material and the second material, the limitation effect of the optical fiber is stronger, increasing the efficiency of total internal reflection. Moreover, the range of viewing angle can also be determined by selection of the refractive index difference.

Optionally, the first material is $Al_2O_3$, MgO, $Y_2O_3$, $CeF_3$, $LaF_3$, SiO or $YF_3$; the second material is $MgF_2$, $SiO_2$, $BaF_2$, $AlF_3$, $CaF_2$, LiF, $Na_3AlF_6$, $Al_3F_{14}Na_5$ or NaF.

The first material and/or the second material can be prepared by sputtering, evaporation plating or chemical vapor deposition. The optical fiber array can be fabricated with e.g. a lithography process and an ion beam etching process.

Optionally, the optical waveguide further comprises a flexible sheet; the flexible sheet is integrally formed with the optical fiber array. The axis of each optical fiber is perpendicular to the surface of the flexible sheet.

An imprinting process can be used for manufacturing the optical waveguide. The formed optical waveguide can be flexibly applied onto a light exit surface of a display substrate or a display device. For example, the transparent substrate 102 in FIGS. 2-4 can be a flexible sheet; therefore the optical waveguide 100 can be flexibly applied onto a light exit surface of a display substrate or a display device.

Optionally, the flexible sheet and the optical fiber array are made of PC or PMMA.

Those skilled in the art can understand that the flexible sheet and the optical fiber array can also be made of other organic/inorganic materials.

Optionally, the surface is a plane.

The optical waveguide provided by the embodiment of the present invention can be used in a plane display substrate or display device; it can also be used on a curved surface (e.g., the surface of a curved surface display).

Optionally, the optical fiber array is a hexagonal array.

A hexagonal array can contain optical fibers as many as possible on a given area, reducing the loss of light.

An embodiment of the present invention further provides a method for manufacturing an optical waveguide. The method comprises arranging an optical fiber array on a surface. Each optical fiber in the optical fiber array has a cylindrical shape; the axis of each optical fiber is perpendicular to the surface.

Due to the total reflection effect, the incident light into the optical fiber undergoes multiple total reflections in the optical fiber. On the light exit surface of each optical fiber, the emitted light will be limited in a certain range of a cone, which is decided by the refractive index difference between inside and outside of the optical fiber, i.e., the range of a cone is decided by the numerical aperture NA of the optical fiber. Therefore, even if the light intensity and color of the incident light into the optical fiber change with angle, after conduction and mixing by the optical fiber, the light intensity and color of the emitted light from the optical fiber are basically homogeneous in the range of the cone. With the effect of limitation and mixing of the optical fibers, the intensity and color of the light from the optical waveguide are basically homogeneous in the whole emitting range, effectively improving the viewing angle characteristics of the display device, and solving the problem of uneven brightness and color bias in the range of viewing angle.

Optionally, the cylindrical shape meets D/L<0.33; D is the diameter of the cylindrical shape, and L is the height of the cylindrical shape.

If the cylindrical shape meets D/L<0.33, the effect of limitation and mixing of optical fibers is more significant, the viewing angle characteristics of the display device can be further improved.

FIG. 5a-FIG. 5d are schematic diagrams of the steps in a method for manufacturing an optical waveguide according to an embodiment of the present invention.

Figure 5A:
FIG. 5a-FIG. 5d are schematic diagrams of the steps in a method for manufacturing an optical waveguide according to an embodiment of the present invention.
Figure 5B:
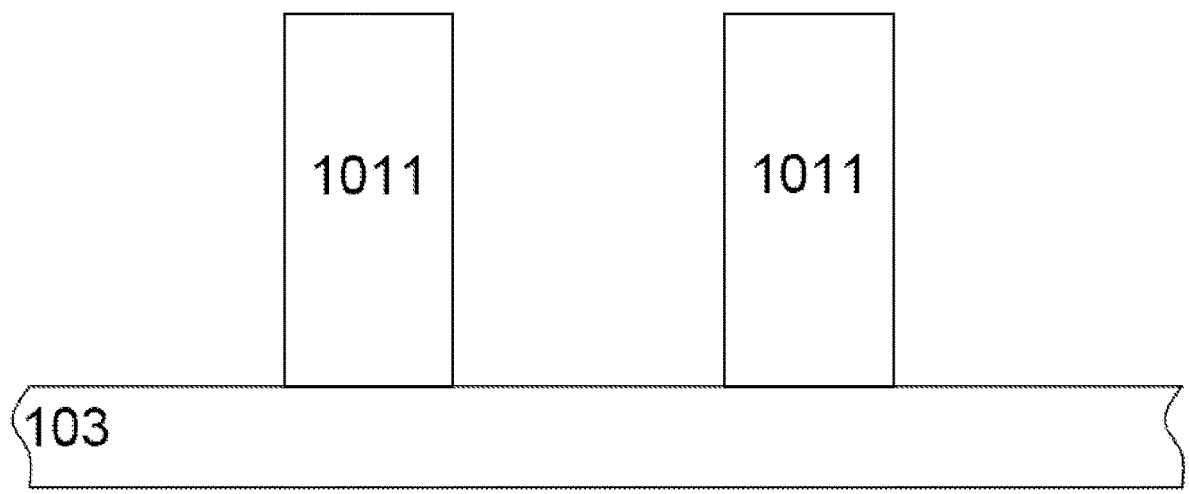
Figure 5C:
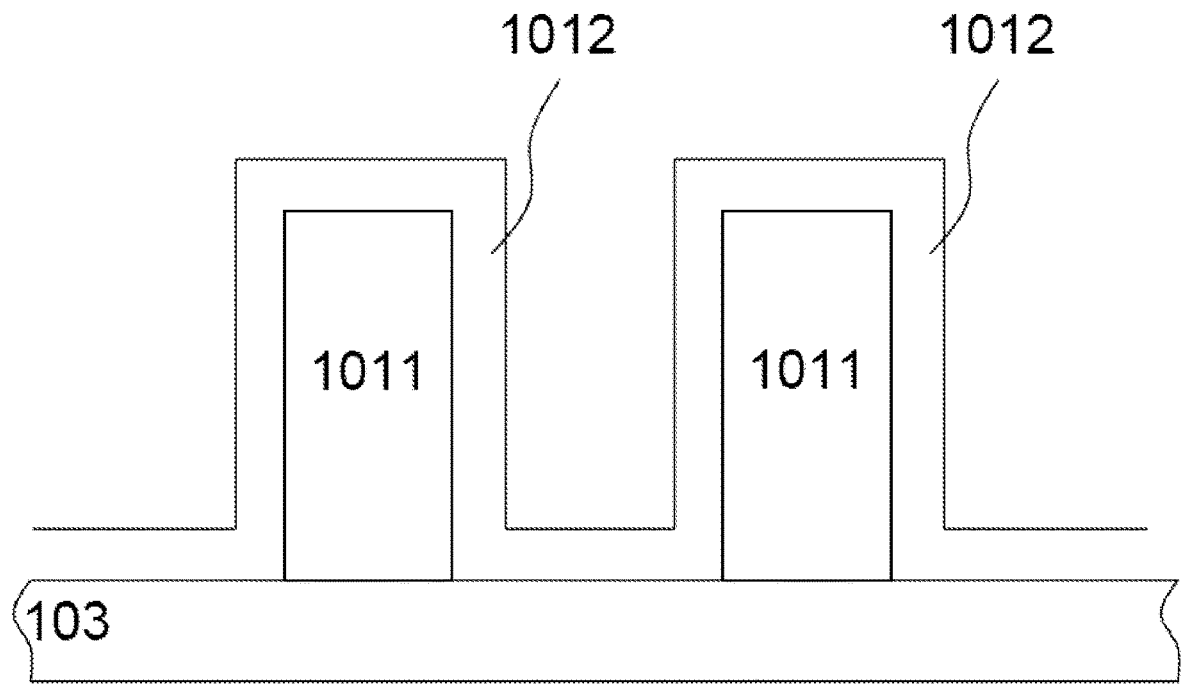
Figure 5D:
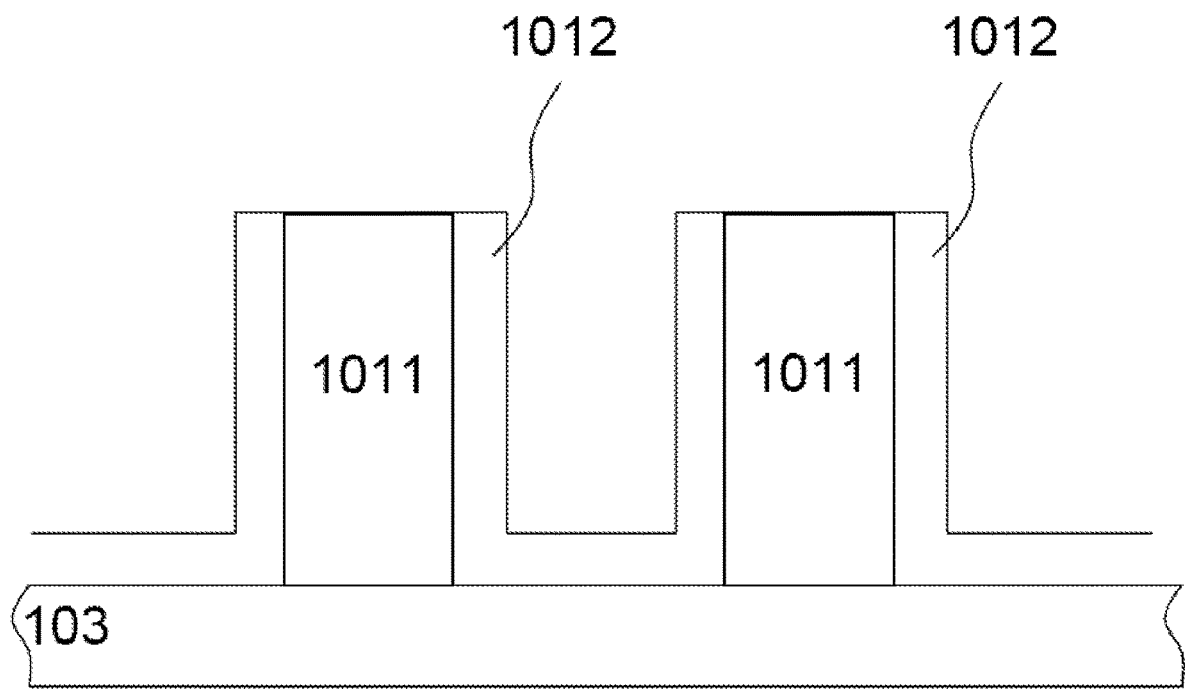

Optionally, as shown in FIG. 5a-FIG. 5d, the surface is a surface of a substrate 103. The step of arranging an optical fiber array on the surface comprises: preparing a layer of a first material 1011 on the surface of the substrate 103, as shown in FIG. 5a; etching the layer of the first material 1011 into an optical fiber array using lithography process, as shown in FIG. 5b; covering the surface of the optical fiber array with a layer of a second material 1012, as shown in FIG. 5c; and removing the second material 1012 from the top of the optical fiber in the optical fiber array, as shown in FIG. 5d. The refractive index of the first material is higher than the refractive index of the second material.

With the refractive index difference between the first material and the second material, the limitation effect of the optical fiber is stronger, increasing the efficiency of total internal reflection. Moreover, the range of viewing angle can also be determined by selection of the refractive index difference.

Optionally, the first material is $Al_2O_3$, MgO, $Y_2O_3$, $CeF_3$, $LaF_3$, SiO or $YF_3$; the second material is $MgF_2$, $SiO_2$, $BaF_2$, $AlF_3$, $CaF_2$, LiF, $Na_3AlF_6$, $Al_3F_{14}Na_5$ or NaF.

The first material and/or the second material can be prepared by sputtering, evaporation plating or chemical vapor deposition. The optical fiber array can be fabricated with e.g. a lithography process and an ion beam etching process.

In an embodiment of the present invention, a method for manufacturing the optical waveguide comprises the following steps.

Step 1: as shown in FIG. 5a, a film of a first material 1011 (e.g., with a thickness of L and a refractive index n=1.55~1.80 at 500 nm) can be prepared on a substrate 103 of an OLED device with a process of vacuum evaporation, sputtering, evaporation plating or chemical vapor deposition (CVD). The first material is $Al_2O_3$ (n=1.65), MgO (n=1.70), $Y_2O_3$ (n=1.80), $CeF_3$ (n=1.63), $LaF_3$ (n=1.58), SiO (n=1.55) or $YF_3$ (n=1.55).

Step 2: coating a layer of photoresist (not shown) on the film of the first material 1011; by exposing and developing, the photoresist is shaped into a cylinder array; the diameter of the photoresist cylinder is D. Ion beam etching with plasma of Ar gas is then performed in a direction perpendicular to the direction of the substrate of the OLED device. The morphology of the photoresist cylinder array is copied to the film of the first material 1011, forming an array of cylinder with a diameter of D and a height of L, as shown in FIG. 5b.

Step 3: as shown in FIG. c, a film of a second material 1012 (e.g., with a thickness of 100 nm and a refractive index n<1.5 at 500 nm) can be prepared on the cylinder array with a process of vacuum evaporation, sputtering, evaporation plating or chemical vapor deposition (CVD). The second material is $MgF_2$ (n=1.38), $SiO_2$ (n=1.46), $BaF_2$ (n=1.40), $AlF_3$ (n=1.35), $CaF_2$ (n=1.43), LiF (n=1.36), $Na_3AlF_6$ (n=1.33), $Al_3F_{14}Na_5$ (n=1.33), or NaF (n=1.29).

Step 4: Ion beam etching with plasma of Ar gas is then performed in a direction perpendicular to the direction of the substrate of the OLED device. Due to the anisotropy and directivity of ion beam etching, the film of the second material 1012 located on the top of the cylinder array can be etched off, and the second material 1012 located between the cylinders can be partially etched off, forming a layer of the second material covering the cylindrical surface of the optical fiber, as shown in FIG. 5d.

Optionally, the surface is a surface of a substrate. The step of arranging an optical fiber array on the surface comprises: preparing a layer of a first material on the surface of the substrate; and imprinting the layer of the first material into an optical fiber array or a flexible sheet with an optical fiber array. The axis of each optical fiber is perpendicular to the surface of the flexible sheet.

An imprinting process can be used for manufacturing the optical waveguide. The formed optical waveguide can be flexibly applied onto a light exit surface of a display substrate or a display device. For example, the transparent substrate 102 in FIGS. 2-4 can be a flexible sheet; therefore the optical waveguide 100 can be flexibly applied onto a light exit surface of a display substrate or a display device.

Optionally, the first material is PC or PMMA.

Those skilled in the art can understand that the flexible sheet and the optical fiber array can also be made of other organic/inorganic materials.

In an embodiment of the present invention, a method for manufacturing the optical waveguide comprises the following steps.

Step 1: coating a layer of flexible film with a high refractive index (e.g., polycarbonate with n=1.585 or PMMA with n=1.49) on a glass substrate.

Step 2: by applying a nanoimprinting process, directly imprinting the flexible film into a periodically arranged array of cylinders (i.e., optical fibers) with a diameter of D and a height of L. In this case, the core of the optical fiber is the flexible film material; the package layer is air. Similarly, if the cylindrical shape meets D/L<0.33, the effect of limitation and mixing of optical fibers is more significant, the viewing angle characteristics of the display device can be further improved.

The flexible film with the optical fiber array provided by the embodiment of the invention can be attached onto a light exit surface of an OLED array (or, a light exit surface of an OLED display panel), thereby effectively improving the viewing angle characteristics of the display device.

Optionally, the surface is a plane.

The optical waveguide provided by the embodiment of the present invention can be used in a plane display substrate or display device; it can also be used on a curved surface (e.g., the surface of a curved surface display).

Optionally, the optical fiber array is a hexagonal array.

A hexagonal array can contain optical fibers as many as possible on a given area, reducing the loss of light.

An embodiment of the present invention further provides a display substrate. The display substrate comprises a light output surface and the optical waveguide according to the abovementioned embodiments; the optical waveguide is attached to the light output surface.

Due to the total reflection effect, the incident light into the optical fiber undergoes multiple total reflections in the optical fiber. On the light exit surface of each optical fiber, the emitted light will be limited in a certain range of a cone, which is decided by the refractive index difference between inside and outside of the optical fiber, i.e., the range of a cone is decided by the numerical aperture NA of the optical fiber. Therefore, even if the light intensity and color of the incident light into the optical fiber change with angle, after conduction and mixing by the optical fiber, the light intensity and color of the emitted light from the optical fiber are basically homogeneous in the range of the cone. With the effect of limitation and mixing of the optical fibers, the intensity and color of the light from the optical waveguide are basically homogeneous in the whole emitting range, effectively improving the viewing angle characteristics of the display device, and solving the problem of uneven brightness and color bias in the range of viewing angle.

Optionally, the light output surface is a light output surface of an OLED array.

The optical waveguide can be applied on a light exit surface of an OLED array (or, on a light exit surface of an OLED display panel), effectively improving the viewing angle characteristics of the OLED display device, and solving the problem of uneven brightness and color bias in the range of viewing angle. Moreover, those skilled in the art can understand that the diameter of the optical fiber (i.e., the diameter D of the cylindrical shape) in the optical waveguide can be predetermined based on the size of the pixel. For example, for an OLED pixel size of 300 nm*100 nm, the diameter of the optical fiber can be predetermined as 50 nm-500 nm; due to the homogeneous distribution of the optical fibers, the optical waveguide can effectively improve the viewing angle characteristics of the display device with substantially no loss of light, without alignment between the respective pixels and the optical fibers.

Therefore, the light exit surface can also be a light exit surface of a liquid crystal display panel, which is not limited herein.

Optionally, the display substrate is a flexible display substrate.

For a flexible display substrate, the viewing angle characteristics of the display device may further be degraded due to the bending. By providing the optical waveguide on the light exit surface of the flexible display substrate, the degraded viewing angle characteristics of the flexible display device due to the bending can then be improved.

An embodiment of the present invention further provides a display device. The display device comprises the display substrate according to the abovementioned embodiments.

Due to the total reflection effect, the incident light into the optical fiber undergoes multiple total reflections in the optical fiber. On the light exit surface of each optical fiber, the emitted light will be limited in a certain range of a cone, which is decided by the refractive index difference between inside and outside of the optical fiber, i.e., the range of a cone is decided by the numerical aperture NA of the optical fiber. Therefore, even if the light intensity and color of the incident light into the optical fiber change with angle, after conduction and mixing by the optical fiber, the light intensity and color of the emitted light from the optical fiber are basically homogeneous in the range of the cone. With the effect of limitation and mixing of the optical fibers, the intensity and color of the light from the optical waveguide are basically homogeneous in the whole emitting range, effectively improving the viewing angle characteristics of the display device, and solving the problem of uneven brightness and color bias in the range of viewing angle.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

What is claimed is:

1. A method for manufacturing an optical waveguide, comprising:
arranging an optical fiber array on a surface of a transparent substrate;
wherein each optical fiber in the optical fiber array has a cylindrical shape; an axis of each optical fiber being perpendicular to the surface of the transparent substrate; a light exit surface of each optical fiber is substantially parallel to the surface of the transparent substrate, wherein arranging the optical fiber array on the surface of the transparent substrate comprises:

preparing a layer of a first material on the surface of the transparent substrate;

etching the layer of the first material into an optical fiber array using a lithography process;

covering the optical fiber array with a layer of a second material; and removing the second material from the top of the optical fiber in the optical fiber array;

wherein the refractive index of the first material is higher than the refractive index of the second material.

2. The method according to claim 1, wherein the cylindrical shape satisfies the relationship of $D/L<0.33$; wherein D is the diameter of the cylindrical shape, and L is the height of the cylindrical shape.

3. The method according to claim 1, wherein the first material is selected from $Al_2O_3$, $MgO$, $Y_2O_3$, $CeF_3$, $LaF_3$, SiO or $YF_3$; and wherein the second material is selected from $MgF_2$, $SiO_2$, $BaF_2$, $AlF_3$, $CaF_2$, LiF, $Na_3AlF_6$, $Al_3F_{14}Na_5$ or NaF.

4. The method according to claim 1, wherein arranging the optical fiber array on the surface of the transparent substrate comprises:

preparing a layer of a first material on the surface of the transparent substrate; and imprinting the layer of the first material into an optical fiber array or a flexible sheet with an optical fiber array; the axis of each optical fiber being perpendicular to a surface of the flexible sheet.

5. The method according to claim 4, wherein the first material is selected from polycarbonate or poly(methyl methacrylate).

6. The method according to claim 1, wherein the surface of the transparent substrate is a plane.

7. The method according to claim 1, wherein the optical fiber array is a hexagonal array.

* * * * *